(12) United States Patent
Zhang

(10) Patent No.: US 12,312,523 B2
(45) Date of Patent: May 27, 2025

(54) QUANTUM DOT LIGHT EMITTING DEVICE AND METHOD FOR PREPARING THE SAME, AND QUANTUM DOT DISPLAY DEVICE

(71) Applicants: Beijing BOE Technology Development Co., Ltd., Beijing (CN); BOE Technology Group Co., Ltd., Beijing (CN)

(72) Inventor: Aidi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 846 days.

(21) Appl. No.: 17/468,575

(22) Filed: Sep. 7, 2021

(65) Prior Publication Data

US 2022/0085312 A1   Mar. 17, 2022

(30) Foreign Application Priority Data

Sep. 15, 2020   (CN) .......................... 202010968433.1

(51) Int. Cl.
*H01L 51/50*   (2006.01)
*C09K 11/06*   (2006.01)
(Continued)

(52) U.S. Cl.
CPC ............ *C09K 11/06* (2013.01); *H10K 50/115* (2023.02); *H10K 71/00* (2023.02); *H10K 85/50* (2023.02);
(Continued)

(58) Field of Classification Search
None
See application file for complete search history.

(56) References Cited

U.S. PATENT DOCUMENTS

2005/0142379 A1*  6/2005  Juni ...................... H10K 59/879
                                                        428/323
2020/0013976 A1*  1/2020  Zhong .................. H10K 50/115

FOREIGN PATENT DOCUMENTS

CN        108690619 A    10/2018
CN        109651597 A     4/2019
(Continued)

OTHER PUBLICATIONS

Xie et., al., Branched capping ligands improve the stability of cesium lead halide (CsPbBr3) perovskite quantum dots†; J. Mater. Chem. C, 2019, 7, 11251-11257 (Year: 2019).*
(Continued)

*Primary Examiner* — Gregory D Clark
(74) *Attorney, Agent, or Firm* — IPro, PLLC

(57) ABSTRACT

The present disclosure provides a quantum dot light emitting device, a method for preparing the same, and a quantum dot display device. The quantum dot light emitting device includes a first electrode layer, a first functional layer, a light emitting layer, a second functional layer, and a second electrode layer, and the light emitting layer being located on a surface of the first functional layer away from the first electrode layer and including perovskite quantum dots and ligands bonded to the quantum dots. The ligands in the quantum dot light emitting device can form into a network to wrap the quantum dots, which is conducive to keeping the light emitting layer with a better morphology, and reducing damage to the quantum dot structure caused by the solvent in the adjacent functional layers, thereby improving the stability of the light emitting layer and the lifetime of the device.

16 Claims, 3 Drawing Sheets

(51) Int. Cl.
_H10K 50/115_ (2023.01)
_H10K 71/00_ (2023.01)
_H10K 85/50_ (2023.01)
_H10K 71/40_ (2023.01)
_H10K 85/30_ (2023.01)

(52) U.S. Cl.
CPC .... _C09K 2211/10_ (2013.01); _C09K 2211/188_ (2013.01); _H10K 71/40_ (2023.02); _H10K 85/30_ (2023.02)

(56) References Cited

FOREIGN PATENT DOCUMENTS

| CN | 110684522 A | 1/2020 |
|---|---|---|
| CN | 111393908 A | 7/2020 |

OTHER PUBLICATIONS

CN 202010968433.1 first office action.

\* cited by examiner

QUANTUM DOT LIGHT EMITTING DEVICE AND METHOD FOR PREPARING THE SAME, AND QUANTUM DOT DISPLAY DEVICE

CROSS-REFERENCE TO RELATED APPLICATION

This application claims a priority to Chinese Patent Application No. 202010968433.1 filed on Sep. 15, 2020, the disclosures of which are incorporated in their entirety by reference herein.

TECHNICAL FIELD

The present disclosure relates to the field of display technology, in particular to a quantum dot light emitting device and a method for preparing the same, and a quantum dot display device including the quantum dot light emitting device.

BACKGROUND

Perovskite-type material (general formula is $ABX_3$) is an important fluorescent material, has some advantages, such as low temperature synthesis by a solution process, low cost, and high fluorescence quantum yield, and thus is widely used in the field of quantum dot light emitting diode (QLED).

Perovskite quantum dot light emitting diodes usually have a multilayer structure, mainly including anode/hole transport layer/light emitting layer/electron transport layer/negative electrode and other layers. In the preparation of perovskite quantum dot light emitting diode devices, the solvent used in the preparation of the hole transport layer or the electron transport layer will have an adverse effect on the adjacent light emitting layers. This is because the polarity of the solvent used in the preparation of the hole transport layer or the electron transport layer is different from the polarity of the solvent used in the preparation of the adjacent light emitting layers. For example, in the film formation process, the film formation of perovskite quantum dots usually uses non-polar solvents, such as hexane, heptane, octane, toluene, chloroform, etc., while the film formation of electron transport materials (for example, zinc oxide particles, etc.) usually uses polar solvents such as ethanol, and ethanol as a solvent has a very large destructive effect on ionic perovskite quantum dots. Ethanol mainly destroys the crystal structure of quantum dots, and thus reduces or quenches the fluorescence performance of the perovskite material, which in turn leads to a decrease in the performance of the light emitting device.

SUMMARY

In a first aspect, the present disclosure provides a quantum dot light emitting device, including: a first electrode layer; a first functional layer, located on a surface of the first electrode layer and including a first transport material; a light emitting layer, located on a surface of the first functional layer away from the first electrode layer and including perovskite quantum dots and ligands bonded to the quantum dots; a second functional layer, located on a surface of the light emitting layer away from the first functional layer and including a second transport material; and a second electrode layer, located on a surface of the second functional layer away from the light emitting layer.

Optionally, the quantum dot includes a metal ion Me, the ligand includes hydroxyl OH, and the quantum dots and the ligands are bonded by forming a Me-OH chemical bond.

Optionally, the metal ion Me includes one or more of lead ion, tin ion, antimony ion, bismuth ion and silver ion.

Optionally, each quantum dot is bonded with a plurality of ligands, intra-quantum-dot hydrogen bonds are formed between the plurality of ligands bonded to the same quantum dot, and inter-quantum-dot hydrogen bonds are formed between the ligands bonded to different quantum dots, so that the ligands form into a network structure, and the network structure wraps the quantum dots.

Optionally, the quantum dot is one or more selected from the following perovskite quantum dots: lead-containing perovskite quantum dot $CsPbX_3$ or $MAPbX_3$; tin-containing perovskite quantum dot $CsSnX_3$, $Cs_2SnX_6$ or $MASnX_3$; antimony-containing perovskite quantum dot $CsSbX_3$ or $MASbX_3$; silver-containing perovskite quantum dot $Cs_2AgInCl_6$; bismuth-containing perovskite quantum dots $MABiX_3$ or $(MA)_3Bi_2X_9$; and the above perovskite quantum dots doped with rare earth ions, in which MA is $CH_3NH_3$, and X is Cl, Br or I.

Optionally, the ligand includes a phosphonic acid compound.

Optionally, the phosphonic acid compound is one or more selected from a group consisting of octyl phosphonic acid, decyl phosphonic acid, nonyl phosphonic acid, dodecyl phosphonic acid, tetradecyl phosphonic acid, hexadecyl phosphonic acid, octadecyl phosphonic acid and eicosyl phosphonic acid.

Optionally, one of the first functional layer and the second functional layer is a hole transport layer, and the other is an electron transport layer, in which the quantum dot light emitting device further includes: a base substrate, located on a surface of the first electrode away from the first functional layer; and a hole injection layer, located on a surface of the hole transport layer away from the light emitting layer.

In a second aspect, the present disclosure provides a quantum dot display device, including any of the above quantum dot light emitting devices.

In a third aspect, the present disclosure provides a method for preparing the above quantum dot light emitting device, including: providing a base substrate and forming a first electrode layer on the base substrate; dissolving the first transport material into a first solvent to form a first solution, and coating the first solution on the first electrode layer to form a first functional layer; dispersing the perovskite quantum dots bonded with ligands into a third solvent to form a quantum dot dispersion; coating the quantum dot dispersion on the first functional layer to form a light emitting layer; dissolving the second transport material into a second solvent to form a second solution, and coating the second solution on the light emitting layer to form a second functional layer; and forming a second electrode layer on the second functional layer.

Optionally, the dispersing the perovskite quantum dots bonded with ligands in the third solvent to form the quantum dot dispersion includes: modifying the quantum dots with the ligands to obtain quantum dots bonded with ligands; purifying and washing the quantum dots bonded with ligands; and dispersing the purified and washed quantum dots bonded with ligands into a third solvent to form a quantum dot dispersion.

Optionally, the coating the quantum dot dispersion on the first functional layer to form the light emitting layer includes: dropping the quantum dot dispersion onto the first functional layer, uniformly spin-coating it by using a homogenizer, and then drying it at a temperature in a range from 25° C. to 120° C. to form a film.

Optionally, one of the first functional layer and the second functional layer is a hole transport layer, and the other is an electron transport layer, in which the method further includes: forming a hole injection layer, the hole injection layer being located on a surface of the hole transport layer away from the light emitting layer.

The quantum dot light emitting device, the method for preparing the same, and the quantum dot display device of the present disclosure bring the following beneficial technical effects.

In the quantum dot light emitting device of the present disclosure, the introduced ligand can form a network, and the network can wrap the perovskite quantum dots in the light emitting layer, which is conducive to keeping the light emitting layer with a better morphology, and reducing or inhibiting damage to the quantum dot structure caused by the solvent in the adjacent functional layers, thereby improving the stability of the light emitting layer and the lifetime of the light emitting device, etc. In addition, the quantum dots dispersed within the network formed by the ligands can avoid the aggregation of quantum dots during the preparation of the quantum dot light emitting layer; it is beneficial to isolate oxygen molecules from entering the light emitting layer to prevent the oxidation of metal ions in the perovskite quantum dots, and to reduce the quenching effect of the zinc oxide layer in the inverted QLED device structure on the quantum dot layer. All of the above further improve the performance of QLED devices.

DETAILED DESCRIPTION

Figure 1:
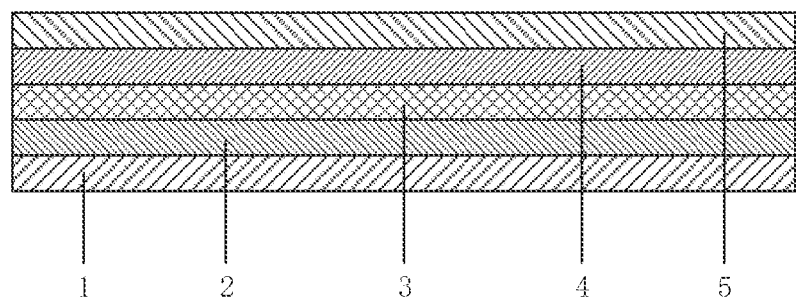
FIG. 1 is a schematic view showing a cross-sectional structure of a quantum dot light emitting device provided according to an embodiment of the disclosure.

The technical solutions of the present disclosure will be described in detail below in conjunction with the drawings and the detailed description. In the drawings, same or similar reference numerals indicate the same or similar parts, or parts having the same or similar functions. The embodiments described below in conjunction with the drawings are exemplary, and are merely used to explain the present disclosure, and cannot be construed as limiting the present disclosure.

Those skilled in the art would understand that, unless otherwise defined, all terms (including technical and scientific terms) used herein have the same meaning as those commonly understood by those skilled in the art to which the present disclosure belongs; unless otherwise specifically stated, the singular forms of "a", "an", "said" and "the" used herein may also include plural forms. It should be further understood that the term "including" used in the specification of the present disclosure refers to the presence of the described features, integers, steps, operations, elements and/or components, but does not exclude the presence or addition of one or more other features, integers, steps, operations, elements, components, and/or groups thereof.

The inventors of the present disclosure have recognized that in the preparation of perovskite quantum dot light emitting diode devices, the solvent used in the preparation of the hole transport layer or the electron transport layer will have an adverse effect on the adjacent light emitting layers. This is because the polarity of the solvent used in the preparation of the hole transport layer or the electron transport layer is different from the polarity of the solvent used in the preparation of the adjacent light emitting layers. For example, the film formation of perovskite quantum dots usually uses non-polar solvents, such as hexane, heptane, octane, toluene, chloroform, etc., while the electron transport materials (for example, zinc oxide particles, etc.) are usually dispersed in polar solvents such as ethanol, and ethanol solvents have a very large destructive effect on ionic perovskite quantum dots. This will reduces or quenches the fluorescence performance of the perovskite material, which in turn leads to a decrease in the performance of the light emitting device.

In view of the above technical problems in the prior art, the present disclosure provides a quantum dot light emitting device and a method for preparing the same, and a quantum dot display device including the quantum dot.

The technical solutions of the present disclosure and how to solve the above technical problems are described in detail below in conjunction with specific embodiments.

Figure 5:
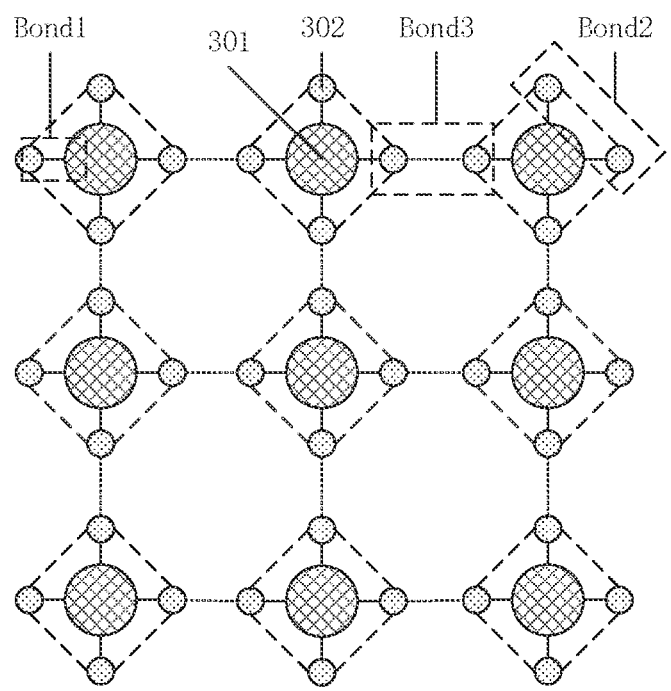
FIG. 5 is a schematic view showing a structure of a network formed by ligands in the light emitting layer of a quantum dot light emitting device provided according to an embodiment of the disclosure.
Figure 6:
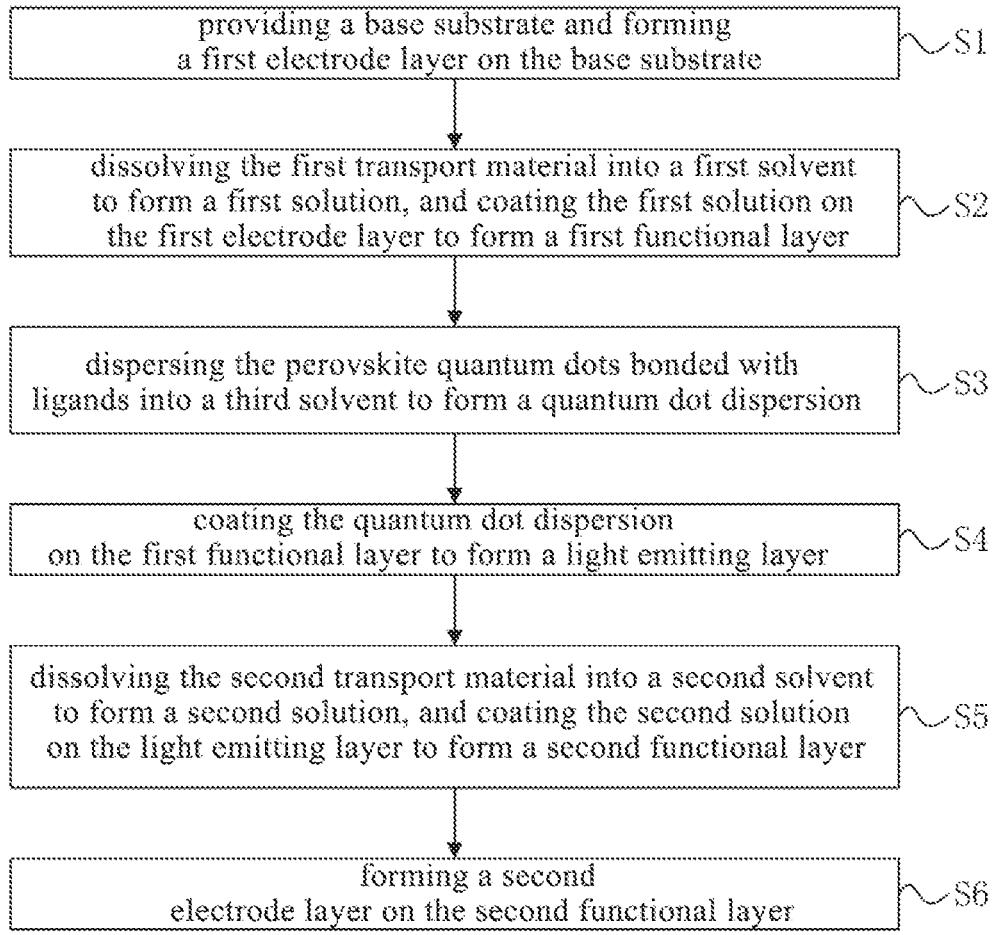
FIG. 6 is a schematic flowchart showing a method for preparing a quantum dot light emitting device provided according to an embodiment of the disclosure.

The embodiment of the present disclosure provides a quantum dot light emitting device, as shown in FIGS. 1 and 5, including: a first electrode layer 1; a first functional layer 2, which is located on a surface of the first electrode layer 1 and includes a first transport material; a light emitting layer 3, which is located on a surface of the first functional layer 2 away from the first electrode layer 1 and includes perovskite quantum dots 301 and ligands 302 bonded to the perovskite quantum dots 301, ligands 302 form into a network structure; a second functional layer 4, which is located on a surface of the light emitting layer 3 away from the first functional layer 2 and includes a second transport material; and a second electrode layer 5, which is located on a surface of the second functional layer away from the light emitting layer 3. As shown in FIG. 5, each perovskite quantum dot 301 is bonded with a plurality of ligands 302 (i.e., bond 1), intra-quantum-dot hydrogen bonds (i.e., bond 2) are formed between the plurality of ligands 302 bonded to the same quantum dot, and inter-quantum-dot hydrogen bonds (i.e., bond 3) are formed between the ligands 302 bonded to different quantum dots, so that the ligands 302 self-assemble or form into a network structure, and the network structure formed by the self-assembly of the plurality of ligands 302 wraps the quantum dots 301.

In the quantum dot light emitting device provided by the above embodiment of the present disclosure, the introduced ligand 302 can form a self-assembled network, and the self-assembled network can wrap the perovskite quantum dot 301 in the light emitting layer 3. This is conducive to keeping the light emitting layer 3 with a better morphology, and reducing or inhibiting damage to the quantum dot structure caused by the solvent in the adjacent functional layers, thereby improving the stability of the light emitting layer 3 and the lifetime of the light emitting device, etc. In addition, the quantum dots 301 dispersed in the self-assembled network formed by the ligand 302 can avoid the aggregation of quantum dots during the preparation of the quantum dot light emitting layer; it is beneficial to isolate oxygen molecules from entering the light emitting layer 3 to prevent the oxidation of metal ions in the perovskite quantum dots 301, so that the metal ions in the light emitting layer 3 maintain the original state to the greatest extent, and to reduce the quenching effect of the zinc oxide layer in the inverted QLED device structure on the quantum dots in the light emitting layer. All of the above have further improved the performance of QLED devices.

Figure 2:
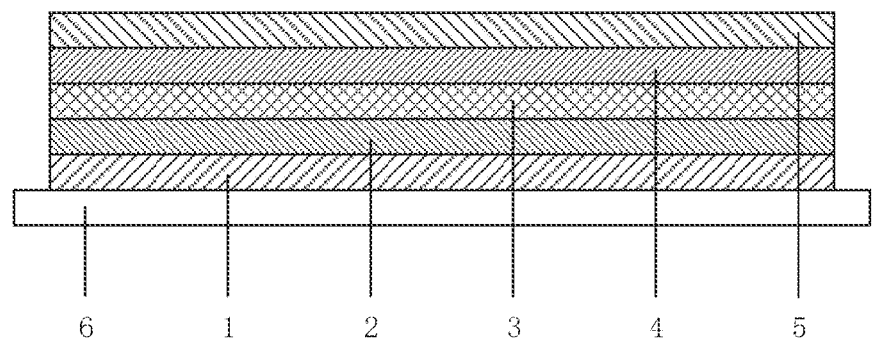
FIG. 2 is a schematic view showing a cross-sectional structure of a quantum dot light emitting device provided according to another embodiment of the present disclosure.

Optionally, as shown in FIG. 2, the quantum dot light emitting device provided by the embodiment of the present disclosure further includes a base substrate 6, which is located on a surface of the first electrode away from the first functional layer 2. Further optionally, the first functional layer 2 is an electron transport layer and the second functional layer 4 is a hole transport layer, or the first functional layer 2 is a hole transport layer and the second functional layer 4 is an electron transport layer.

When the first functional layer 2 is an electron transport layer and the second functional layer 4 is a hole transport layer, the first electrode layer 1 is an anode and the second electrode layer 5 is a cathode; and when the first functional layer 2 is a hole transport layer and the second functional layer 4 is an electron transport layer, the first electrode layer 1 is a cathode and the second electrode layer 5 is an anode.

Figure 3:
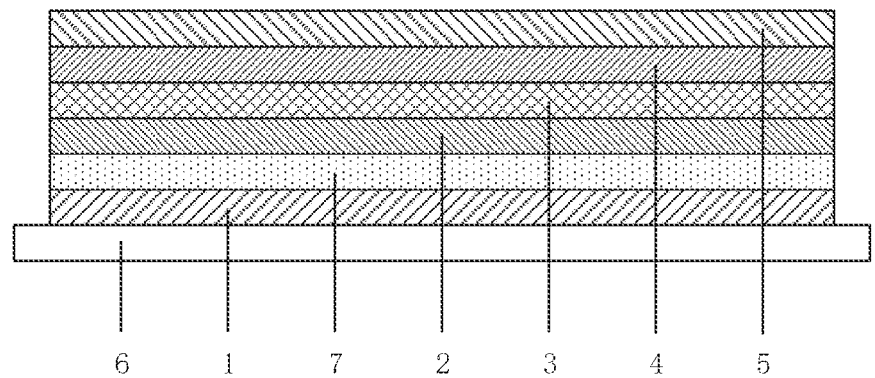
FIG. 3 is a schematic view showing a cross-sectional structure of a quantum dot light emitting device provided according to a still another embodiment of the present disclosure.

Optionally, as shown in FIG. 3, the quantum dot light emitting device provided by the embodiment of the present disclosure further includes a hole injection layer 7, and the hole injection layer 7 is located on a surface of the hole transport layer away from the light emitting layer 3.

Optionally, the perovskite quantum dot 301 includes a metal ion Me, the ligand 302 includes a hydroxyl group —OH, and the perovskite quantum dot 301 and the ligand 302 are bonded by forming a Me-OH chemical bond. In the embodiment of the present disclosure, the perovskite quantum dot 301 and the ligand 302 form a Me-OH chemical bond, which can eliminate the defect on the surface of the quantum dot, protect exposed metal ions, passivate the defect sites, thereby improving the fluorescence performance of the quantum dots and the luminous performance of the light emitting devices.

Optionally, the metal ion Me includes one or more of lead ion, tin ion, antimony ion, bismuth ion and silver ion.

Figure 4:
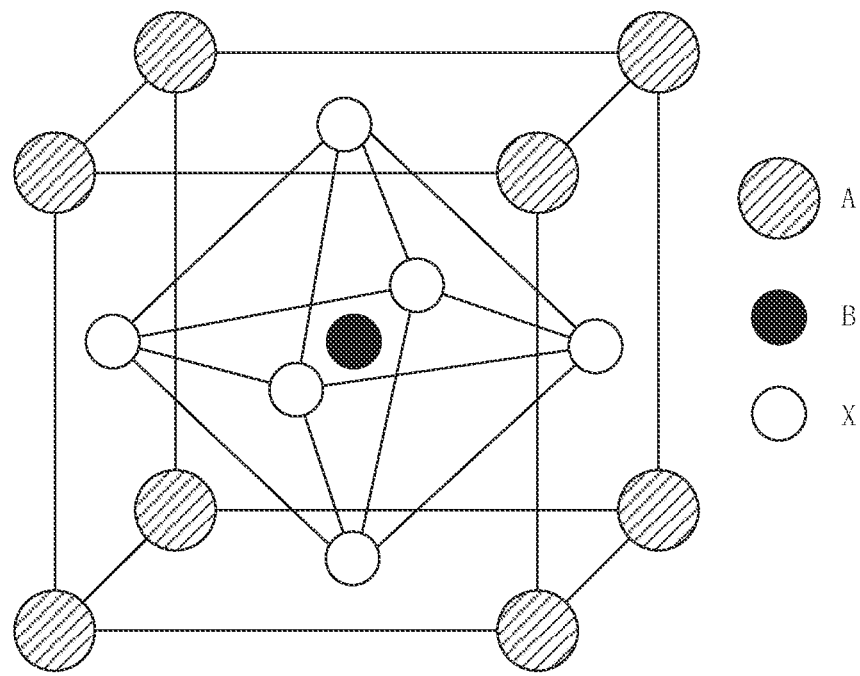
FIG. 4 is a schematic view showing a crystal lattice of the perovskite quantum dots in prior art.

Specifically, as shown in FIG. 4, the general chemical formula of the perovskite quantum dot 301 is $ABX_3$. A can be cesium (Cs), a rare earth metal, an organic group $CH_3NH_3$, etc.; B can be metal lead (Pb), tin (Sn), antimony (Sb), bismuth (Bi), silver (Ag), etc.; and X can be a halogen element, such as F, Cl, Br or I. The perovskite quantum dot 301 according to the difference of B is described below as an example.

(1) Lead-containing perovskite quantum dots: cesium lead halide quantum dots $CsPbX_3$, rare earth metal doped quantum dots $MAPbX_3$ (where MA is $CH_3NH_3$, sometime MA is $CH_3NH_3$ or rare earth element, and the doped rare earth element replaces the position of $CH_3NH_3$ in the lattice structure), organic lead halogen quantum dots $CH_3NH_3PbX_3$, etc., where X is a halogen, preferably Cl, Br or I.

(2) Tin-containing perovskite quantum dots: cesium tin halide quantum dots $CsSnX_3$, $Cs_2SnX_6$, organic tin halide $CH_3NH_3SnX_3$ quantum dots, where X is a halogen, preferably Cl, Br or I.

(3) Antimony-containing perovskite quantum dots: cesium antimony halogen quantum dots $CsSbX_3$, organic antimony halogen quantum dots $CH_3NH_3SbX_3$, etc., where X is a halogen, preferably Cl, Br or I.

(4) Silver-containing perovskite quantum dots: $Cs_2AgInCl_6$, where X is a halogen, preferably Cl, Br or I.

(5) Bismuth-containing perovskite quantum dots: organic bismuth halogen quantum dots $CH_3NH_3BiX_3$, $(CH_3NH_3)_3Bi_2X_9$, etc., rare earth doped quantum dots $MA_3Bi_2Br_9$ (MA refers to $CH_3NH_3$, sometime MA is $CH_3NH_3$ or an rare earth element, and rare earth elements replace $CH_3NH_3$ in the lattice structure), where X is halogen, preferably Cl, Br or I.

Optionally, the material of the ligand 302 includes a phosphonic acid compound. Specifically, the material of the ligand 302 may include: octyl phosphonic acid, decyl phosphonic acid, nonyl phosphonic acid, dodecyl phosphonic acid, tetradecyl phosphonic acid, hexadecyl phosphonic acid, octadecyl phosphonic acid and eicosyl phosphonic acid, etc. In addition, the quantum dots 301 can also be bonded with conventional ligands such as oleic acid and/or oleylamine, but it is difficult to achieve the above technical effects of the present disclosure.

In the following, using $CsPbX_3$ as the perovskite quantum dot 301 and octyl phosphonic acid as the ligand 302, the formation process of the quantum dot light emitting layer 3 will be described in detail.

As shown in FIGS. 4 and 5, there are a plurality of lead ions ($Pb^{4+}$) distributed on the surface of the $CsPbBr_3$ quantum dots, and the lead ions ($Pb^{4+}$) form Pb—O chemical bond with the hydroxyl group (OH) in octyl phosphonic acid. Therefore, the surface of the $CsPbBr_3$ quantum dot modified with the octyl phosphonic acid ligand 302 has a plurality of octyl phosphonic acid ligands 302 bonded to the surface. Under the action of acetonitrile, the $CsPbBr_3$ quantum dots modified by the octyl phosphonic acid ligand 302 form intermolecular hydrogen bonds between the octyl phosphonic acid ligands 302, to form octyl phosphate.

First, the reaction formula for the modification of $CsPbBr_3$ quantum dots with octyl phosphonic acid ligand 302 is shown as follows:

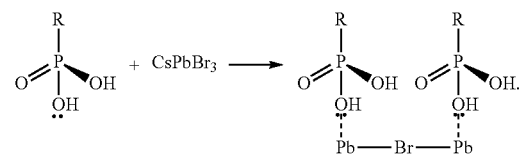

Specifically, as shown in the above reaction formula, the Pb on the surface of the $CsPbBr_3$ quantum dot and the hydroxyl group on the ligand form Pb—O chemical bond, that is, the first chemical bond (bond 1) shown in FIG. 5. The Cs in the quantum dot lattice structure does not involve the above reaction, so it is not shown in the reaction formula, and R in the reaction formula refers to octyl.

Then, the self-assembly process of CsPbBr$_3$ quantum dots modified with octyl phosphonic acid ligand under the action of acetonitrile is shown in the following reaction formula:

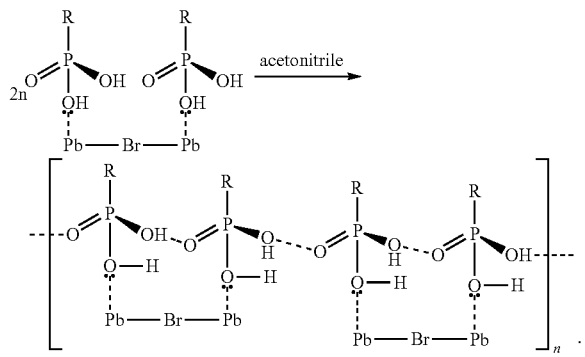

Specifically, as shown in the above reaction formula, the Cs in the quantum dot lattice structure does not involve the above reaction, so it is not shown in the reaction formula, and R in the reaction formula refers to octyl.

Please refer to FIG. 5 and the above reaction formula, the octyl phosphonic acid ligands form hydrogen bonds, including intramolecular hydrogen bonds and intermolecular hydrogen bonds. The intramolecular hydrogen bond refers to the hydrogen bond formed between octyl phosphonic acid ligands connected to the same quantum dot, that is, bond 2 shown in FIG. 5. The intermolecular hydrogen bond refers to the hydrogen bond that can be formed between octyl phosphonic acid ligands connected to different quantum dots, that is, bond 3 shown in FIG. 5. Through the intramolecular hydrogen bonds (bond 2) and the intermolecular hydrogen bonds (bond 3), the octyl phosphonic acid ligands self-assemble or form into a network structure, and the perovskite quantum dot 301 is wrapped by the network structure composed of the self-assembled phosphonic acid ligand.

It should be noted that although the self-assembled network shown in FIG. 5 is a planar structure, the plurality of octyl phosphonic acid ligands bonded on the surface of the CsPbBr$_3$ quantum dots are not located on the same plane, and the self-assembled network formed is not a self-assembled network of a three-dimensional structure of a plane structure, and the three-dimensional self-assembled network wraps quantum dots therein.

Based on the same inventive concept, the embodiments of the present disclosure also provide a method for preparing a quantum dot light emitting device. The method includes the following steps S1 to S6.

S1: Providing a base substrate 6 and forming a first electrode layer 1 on the base substrate 6.

Specifically, this step specifically includes: providing a base substrate 6 and forming the first electrode layer 1 on the base substrate 6. In specific implementation, according to different requirements, the base substrate 6 can be a rigid substrate such as a glass substrate or a flexible substrate such as a polyimide thin film; the material of the first electrode layer 1 can be a metal material such as aluminum, copper, silver, etc., and can also be a transparent conductive material such as indium tin oxide.

S2: Dissolving the first transport material into a first solvent to form a first solution, and coating the first solution on the first electrode layer 1 to form a first functional layer 2.

Specifically, the first functional layer 2 may be a hole transport layer or an electron transport layer. When the first functional layer 2 is a hole transport layer, the prepared quantum dot light emitting device is an upright quantum dot light emitting device; and when the first functional layer 2 is an electron transport layer, the prepared quantum dot light emitting device is an inverted quantum dot light emitting device. The difference between the upright structure and the inverted structure of the quantum dot light emitting device merely lies in the sequence of the preparing steps, but the specific method of each step is the same. In the following embodiments, only a quantum dot light emitting device with an upright structure is described as an example.

Specifically, TFB (poly(9,9-dioctylfluorene-co-N-(4-butyl phenyl) diphenylamine)) or PVK (polyvinylcarbazole), or other commercial hole transport compound is dissolved into the first solvent to obtain the first solution. Then, the first solution is coated on the first electrode layer 1 by spin coating or inkjet printing, to prepare a hole transport layer. Taking TFB as an example, the TFB solution is dropped on a homogenizer for homogenization, and the film is formed at a temperature in a range from 130° C. to 150° C. in an inert gas environment. The film thickness of the hole transport layer can be adjusted according to the rotation speed of the homogenizer. Specifically, the first solvent can usually be chlorobenzene, 1,2-dichlorobenzene, 3,4-dichloroaniline, 2,6-dichlorobenzaldehyde, 2,5-dichlorobenzonitrile, 3,4-dichlorophenylboronic acid, etc.

S3: Dispersing the perovskite quantum dots bonded with ligands 302 into a third solvent to form a quantum dot dispersion.

S4: Coating the quantum dot dispersion on the first functional layer 2 to form a light emitting layer 3.

Specifically, a CsPbBr$_3$ quantum dot solution modified with octyl phosphonic acid as a ligand is described as an example. This step includes: dropping the quantum dot solution (i.e., the CsPbBr$_3$ quantum dot solution modified with octyl phosphonic acid as a ligand) onto the first functional layer 2, and uniformly spin-coating it with a homogenizer, and then drying it at a temperature in a range from 25° C. to 120° C. to form a film. In this embodiment, the rotation speed of the homogenizer can be adjusted, to adjust the film thickness of the light emitting layer 3.

S5: Dissolving the second transport material in the second solvent to form a second solution, and coating the second solution on the light emitting layer 3 to form a second functional layer 4.

In the quantum dot light emitting device with the upright structure, the second functional layer 4 is an electron transport layer. Zinc oxide nanoparticle or zinc oxide sol-gel is described as an example of the electron transport material.

Specifically, taking zinc oxide nanoparticles as an example, a 10 mg/mL to 30 mg/mL dispersion of zinc oxide nanoparticle with a size of 90 μm to 120 μm is dropped on the light emitting layer 3, and the sample is placed on the homogenizer and spin-coated in a range from 500 rpm to 2500 rpm. Then, the heating is performed at a temperature in a range from 25° C. to 120° C., to obtain a zinc oxide nanoparticle thin film.

Specifically, taking zinc oxide sol-gel as an example, 2 g of zinc acetate is added to 10 mL mixed solvent containing ethanolamine and n-butanol to form a zinc acetate solution, the zinc acetate solution is dropped on the light emitting layer 3, and the sample is placed on the homogenizer and spin coated at a rotation speed in a range from 1000 rpm to 4000 rpm, and the heating is performed at a temperature in a range from 180° C. to 250° C. to form a film. In addition, the electron transport layer material can also be ion-doped zinc oxide nanoparticles, such as Mg, In, Al, Ga and other metal ions doped zinc oxide nanoparticles.

Solvents such as ethanolamine and n-butanol used in electron transport materials have large polarity, while the solvents used in quantum dots (n-hexane, n-heptane, chloroform or toluene, etc.) are non-polar solvents. Therefore, the solvent used in the electron transport material has a certain destructive effect on the structure of the quantum dot layer, and may even reduce or quench the fluorescence performance of the perovskite material. However, the network structure formed by the ligands used in the present disclosure protects the quantum dots, and can effectively reduce the damage to the quantum dots by the polar solvent of the electron transport material. Therefore, even an inverted QLED structure can achieve better performance.

S6: Forming a second electrode layer 5 on the second functional layer 4.

Specifically, a metal film such as an aluminum film, a copper film, or a silver film can be formed on the second functional layer 4 by vapor deposition, or a sputtering method can be used to form an indium tin oxide thin film or an indium zinc oxide thin film.

In the method for preparing the quantum dot light emitting device provided by the embodiment of the present disclosure, the introduced ligand 302 can form a self-assembled network, the self-assembled network can wrap the perovskite quantum dot 301 in the light emitting layer 3, which is conducive to keeping the light emitting layer 3 with a better morphology, and reducing or inhibiting damage to the quantum dot structure caused by the solvent in the adjacent functional layers, thereby improving the stability of the light emitting layer 3 and the lifetime of the light emitting device, etc. In addition, the quantum dots 301 dispersed in the self-assembled network formed by the ligands 302 can avoid the aggregation of quantum dots; it is beneficial to isolate oxygen molecules from entering the light emitting layer 3, to prevent the oxidation of metal ions in the perovskite quantum dots 301, and to reduce the quenching effect of the zinc oxide layer on the quantum dot layer in the inverted QLED device structure. All of the above further improve the performance of QLED devices.

Optionally, the method for preparing the quantum dot light emitting device provided in this embodiment further includes: forming a hole injection layer 7, the hole injection layer 7 being located on a surface of the hole transport layer away from the light emitting layer 3.

Specifically, in the method of preparing the quantum dot light emitting device having an upright structure, the forming the hole injection layer 7 is after the forming the first electrode layer 1 and before the forming the hole transport layer. In the method of preparing a quantum dot light emitting device with an inverted structure, the step of forming the hole injection layer 7 is after the forming the hole transport layer and before the forming the second electrode layer 5.

Taking the preparation of a quantum dot light emitting device with an upright structure as an example, PEDOT:PSS 4083 (poly 3,4-ethylenedioxythiophene/polystyrene sulfonate) is used as the hole injection material, and is coated on the first electrode layer 1 in by a manner such as spin-coating or inkjet printing to form a hole injection layer 7. The sample coated with the PEDOT:PSS 4083 solution is placed on a homogenizer, and spin-coated at a speed in a range from 500 to 2500 rpm, and then heated at a temperature in a range from 130° C. to 30° C. to form a film. In specific implementation, the thickness of the hole injection layer can be adjusted by adjusting the concentration and rotation speed of the solution.

Figure 7:
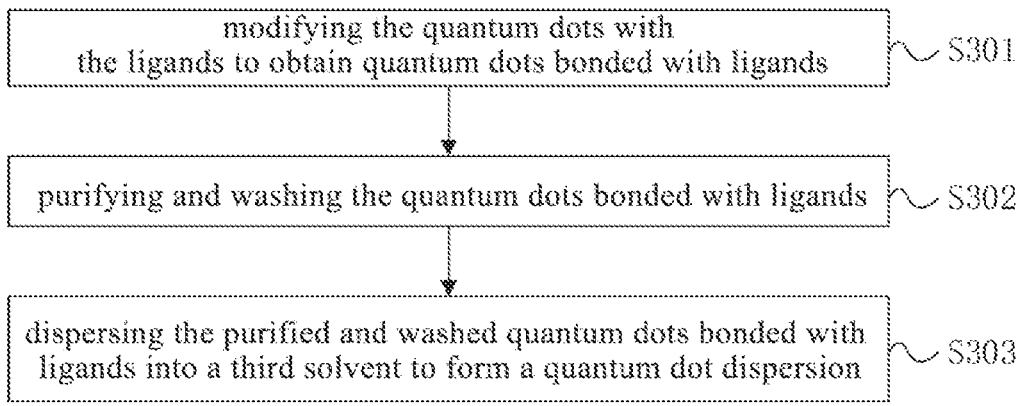
FIG. 7 is a schematic flowchart showing step S3 in the method for preparing the quantum dot light emitting device shown in FIG. 6.

Further, as shown in FIG. 7, in the method for preparing the quantum dot light emitting device provided in this embodiment, step S3 includes steps S301 to S303.

S301: modifying the quantum dots with the ligand 302 to obtain quantum dots bonded with ligands 302. The ligand molecules are added to the non-polar solvent of n-hexane (or n-heptane, chloroform or toluene, etc.) of the perovskite quantum dots, and stirred at room temperature for 30 min to 120 min. 2 times of volumes of ethanol or ethyl acetate is added and subjected to a centrifugal precipitation at a speed in a range from 4000 rpm to 7000 rpm, and the supernatant is poured. Finally, the precipitate is re-dispersed into n-hexane (or n-heptane, chloroform or toluene, etc.) to obtain quantum dots bonded with ligands 302.

S302: Purifying and washing the quantum dots bonded with ligands 302.

Specifically, the purification and washing steps are described by taking the $CsPbBr_3$ quantum dots modified with octyl phosphonic acid as an example.

First, the perovskite quantum dots bonded with ligands 302 are purified. 10 ml of oleic acid-modified $CsPbBr_3$ quantum dot solution (solvent is 1-octadecene (ODE)) with a concentration in a range from 0.1 mmol/ml to 1 mmol/ml is centrifuged at 50000 rpm/min to 10000 pm/min for 10 min to 30 min. The lower quantum dot precipitate is dissolved in 2.5 ml of toluene, and then re-centrifuged at a speed in a range from 50000 rpm/min to 10000 rpm/min for 10 min to 30 min. The toluene clear solution of the upper quantum dots is retained, and the lower precipitate is discarded to obtain a purified toluene solution of the quantum dots.

Then the first washing is performed. Specifically, the quantum dot toluene solution and toluene are mixed uniformly in a volume ratio of 1:1, then 15 ml of ethyl acetate is added and mixed uniformly, and centrifuged at a speed in a range from 2000 rpm/min to 5000 rpm/min for 10 min to 30 min, the supernatant is kept and the precipitate is discarded, to obtain the quantum dot solution after the first washing.

Then a second washing is performed. Specifically, 2.5 ml of acetonitrile is added to the quantum dot solution after the first washing, and mixed uniformly, the above mixed solution is centrifuged at 5000 rpm/min to 10000 rpm/min for 10 min to 30 min, the supernatant is discarded, to obtain the quantum dot solution after the second washing.

S303: Dispersing the purified and washed quantum dots bonded with ligands 302 into a third solvent to form a quantum dot dispersion.

Specifically, the quantum dot solution after the second washing is re-dissolved in 1.5 ml of toluene to obtain a $CsPbBr_3$ quantum dot solution modified with octyl phosphonic acid as the ligand 302.

Optionally, the method for preparing the quantum dot light emitting device provided by the embodiment of the present disclosure further includes: packaging the device with an ultraviolet curing glue under excitation of ultraviolet or the like, and applying a packaging cover for protecting the quantum dot light emitting device.

The above embodiments of the present disclosure can at least achieve the following beneficial effects: the introduced ligand can form a self-assembled network, and the self-assembled network can wrap the perovskite quantum dots in the light emitting layer, which is conducive to keeping the light emitting layer with a better morphology, and reducing or inhibiting damage to the quantum dot structure caused by the solvent in the adjacent functional layers, thereby improving the stability of the light emitting layer and the lifetime of the light emitting device, etc. In addition, the quantum dots dispersed in the self-assembled network formed by the ligands can avoid the aggregation of quantum dots; it is beneficial to isolate oxygen molecules from entering the light emitting layer to prevent the oxidation of metal ions in the perovskite quantum dots, and to reduce the quenching effect of the zinc oxide layer on the quantum dot layer in the inverted QLED device structure. All of the above improves the performance of the QLED device.

Those skilled in the art can understand that various operations, methods, steps, measures, and solutions in the process in the embodiments of the present disclosure can be alternated, changed, rearranged, decomposed, combined, or deleted. In the description of the present disclosure, the orientation or positional relationship indicated by the terms "center", "upper", "lower", "front", "rear", "left", "right", "vertical", "horizontal", "top", "bottom", "inner" and "outer" is based on the orientation or positional relationship shown in the drawings, is merely used for the convenience of describing the present disclosure and simplifying the description, rather than indicating or implying that the device or element must have a specific orientation, or be constructed and operated in a specific orientation, and therefore cannot be understood as a limitation of the present disclosure. The terms "first" and "second" are merely used for descriptive purposes, and cannot be understood as indicating or implying relative importance or implicitly indicating the number of indicated technical features. Thus, the features defined with "first" and "second" may explicitly or implicitly include one or more of these features. In the description of the present disclosure, unless otherwise specified, "plurality" means two or more. The terms "installed", "connected" and "connected" should be understood in a broad sense. For example, it can be a fixed connection, a detachable connection, or an integral connection; it can be directly connected or indirectly connected through an intermediate medium, or it may be the internal communication between two elements. For those skilled in the art, the specific meanings of the above terms in the present disclosure can be understood in specific situations.

The above are merely part of the embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A quantum dot light emitting device, comprising:
a first electrode layer;
a first functional layer, located on a surface of the first electrode layer and comprising a first transport material;
a light emitting layer, located on a surface of the first functional layer away from the first electrode layer and comprising perovskite quantum dots and ligands bonded with the quantum dots;
a second functional layer, located on a surface of the light emitting layer away from the first functional layer and comprising a second transport material; and
a second electrode layer, located on a surface of the second functional layer away from the light emitting layer,
wherein the ligand comprises a phosphonic acid compound,
wherein the quantum dot comprises a metal ion Me, the ligand comprises hydroxyl OH, and the quantum dots and the ligands are bonded by forming a Me-OH chemical bond, and
wherein each quantum dot is bonded with a plurality of ligands, intra-quantum-dot hydrogen bonds are formed between the plurality of ligands bonded to the same quantum dot, and inter-quantum-dot hydrogen bonds are formed between the ligands bonded to different quantum dots, so that the ligands form into a network structure, and the network structure wraps the quantum dots.

2. The quantum dot light emitting device of claim 1, wherein the metal ion Me comprises one or more of lead ion, tin ion, antimony ion, bismuth ion and silver ion.

3. The quantum dot light emitting device of claim 1, wherein the quantum dot is one or more selected from the following perovskite quantum dots:
lead-containing perovskite quantum dot $CsPbX_3$ or $MAPbX_3$; tin-containing perovskite quantum dot $CsSnX_3$, $Cs_2SnX_6$ or $MASnX_3$; antimony-containing perovskite quantum dot $CsSbX_3$ or $MASbX_3$; silver-containing perovskite quantum dot $Cs_2AgInCl_6$; bismuth-containing perovskite quantum dots $MABiX_3$ or $(MA)_3Bi_2X_9$; and the above perovskite quantum dots doped with rare earth ions,
wherein MA is $CH_3NH_3$, and X is Cl, Br or I.

4. The quantum dot light emitting device of claim 1, wherein the phosphonic acid compound is one or more selected from a group consisting of octyl phosphonic acid, decyl phosphonic acid, nonyl phosphonic acid, dodecyl phosphonic acid, tetradecyl phosphonic acid, hexadecyl phosphonic acid, octadecyl phosphonic acid and eicosyl phosphonic acid.

5. The quantum dot light emitting device of claim 1, wherein one of the first functional layer and the second functional layer is a hole transport layer, and the other is an electron transport layer,
wherein the quantum dot light emitting device further comprises:
a base substrate, located on a surface of the first electrode away from the first functional layer; and
a hole injection layer, located on a surface of the hole transport layer away from the light emitting layer.

6. A quantum dot display device, comprising the quantum dot light emitting device of claim 1.

7. The quantum dot display device of claim 6, wherein the quantum dot comprises a metal ion Me, the ligand comprises hydroxyl OH, and the quantum dots and the ligands are bonded by forming a Me-OH chemical bond.

8. The quantum dot display device of claim 7, wherein the metal ion Me comprises one or more of lead ion, tin ion, antimony ion, bismuth ion and silver ion.

9. The quantum dot display device of claim 6, wherein the quantum dot is one or more selected from the following perovskite quantum dots:
lead-containing perovskite quantum dot $CsPbX_3$ or $MAPbX_3$; tin-containing perovskite quantum dot $CsSnX_3$, $Cs_2SnX_6$ or $MASnX_3$; antimony-containing perovskite quantum dot $CsSbX_3$ or $MASbX_3$; silver-containing perovskite quantum dot $Cs_2AgInCl_6$; bismuth-containing perovskite quantum dots $MABiX_3$ or $(MA)_3Bi_2X_9$; and the above perovskite quantum dots doped with rare earth ions,
wherein MA is $CH_3NH_3$, and X is Cl, Br or I.

10. The quantum dot light emitting device of claim 6, wherein the ligand comprises a phosphonic acid compound.

11. The quantum dot light emitting device of claim 10, wherein the phosphonic acid compound is one or more selected from a group consisting of octyl phosphonic acid, decyl phosphonic acid, nonyl phosphonic acid, dodecyl phosphonic acid, tetradecyl phosphonic acid, hexadecyl phosphonic acid, octadecyl phosphonic acid and eicosyl phosphonic acid.

12. A method for preparing the quantum dot light emitting device, comprising:
providing a base substrate and forming a first electrode layer on the base substrate;
dissolving the first transport material into a first solvent to form a first solution, and coating the first solution on the first electrode layer to form a first functional layer;
dispersing the perovskite quantum dots bonded with ligands into a third solvent to form a quantum dot dispersion;
coating the quantum dot dispersion on the first functional layer to form a light emitting layer;
dissolving the second transport material into a second solvent to form a second solution, and coating the second solution on the light emitting layer to form a second functional layer; and
forming a second electrode layer on the second functional layer,
wherein the ligand comprises a phosphonic acid compound,
wherein the quantum dot comprises a metal ion Me, the ligand comprises hydroxyl OH, and the quantum dots and the ligands are bonded by forming a Me-OH chemical bond, and
wherein each quantum dot is bonded with a plurality of ligands, intra-quantum-dot hydrogen bonds are formed between the plurality of ligands bonded to the same quantum dot, and inter-quantum-dot hydrogen bonds are formed between the ligands bonded to different quantum dots, so that the ligands form into a network structure, and the network structure wraps the quantum dots.

13. The method of claim 12, wherein the dispersing the perovskite quantum dots bonded with ligands into the third solvent to form the quantum dot dispersion comprises:

modifying the quantum dots with the ligands to obtain quantum dots bonded with ligands;
purifying and washing the quantum dots bonded with ligands; and
dispersing the purified and washed quantum dots bonded with ligands into a third solvent to form a quantum dot dispersion.

14. The method of claim 12, wherein the coating the quantum dot dispersion on the first functional layer to form the light emitting layer comprises:
dropping the quantum dot dispersion onto the first functional layer, uniformly spin-coating it by using a homogenizer, and then drying it at a temperature in a range from 25° C. to 120° C. to form a film.

15. The method of claim 12, wherein one of the first functional layer and the second functional layer is a hole transport layer, and the other is an electron transport layer,
wherein the method further comprises: forming a hole injection layer, the hole injection layer being located on a surface of the hole transport layer away from the light emitting layer.

16. The method of claim 12, wherein the quantum dot is one or more selected from the following perovskite quantum dots:
lead-containing perovskite quantum dot $CsPbX_3$ or $MAPbX_3$; tin-containing perovskite quantum dot $CsSnX_3$, $Cs_2SnX_6$ or $MASnX_3$; antimony-containing perovskite quantum dot $CsSbX_3$ or $MASbX_3$; silver-containing perovskite quantum dot $Cs_2AgInCl_6$; bismuth-containing perovskite quantum dots $MABiX_3$ or $(MA)_3Bi_2X_9$; and the above perovskite quantum dots doped with rare earth ions, wherein MA is $CH_3NH_3$, and X is Cl, Br or I, and
wherein the ligand comprises a phosphonic acid compound, the phosphonic acid compound being one or more selected from a group consisting of octyl phosphonic acid, decyl phosphonic acid, nonyl phosphonic acid, dodecyl phosphonic acid, tetradecyl phosphonic acid, hexadecyl phosphonic acid, octadecyl phosphonic acid and eicosyl phosphonic acid.

* * * * *